(12) United States Patent  
Sekine

(10) Patent No.: US 6,731,431 B2
(45) Date of Patent: May 4, 2004

(54) OPTICAL UNIT HAVING PLURAL OPTICAL ELEMENTS

(75) Inventor: Yoshiyuki Sekine, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/411,632

(22) Filed: Oct. 1, 1999

(65) Prior Publication Data

US 2003/0043462 A1 Mar. 6, 2003

(30) Foreign Application Priority Data

Oct. 2, 1998  (JP) .......................................... 10-281295

(51) Int. Cl.$^7$ ............................................. G02B 27/44
(52) U.S. Cl. ......................... 359/565; 355/53; 356/399; 156/99; 216/24; 216/26
(58) Field of Search ................................ 359/565, 900; 355/53; 356/399; 156/99; 216/24, 26

(56) References Cited

U.S. PATENT DOCUMENTS

| 4,426,131 A | * | 1/1984 | Gowan | 359/569 |
|---|---|---|---|---|
| 4,966,447 A | * | 10/1990 | Huang Alan et al. | 359/571 |
| 5,101,389 A | | 3/1992 | Ohuchida et al. | 369/44.23 |
| 5,117,306 A | | 5/1992 | Cohen | 359/565 |
| 5,149,181 A | * | 9/1992 | Bedford | 351/166 |
| 5,152,788 A | * | 10/1992 | Isaacson et al. | 359/565 |
| 5,208,700 A | | 5/1993 | Harris et al. | 356/569 |
| 5,229,797 A | * | 7/1993 | Futhey et al. | 359/565 |
| 5,496,616 A | | 3/1996 | Harris | 428/172 |
| 5,629,804 A | | 5/1997 | Tomono | 359/576 |
| 5,771,218 A | * | 6/1998 | Feldman et al. | 257/98 |
| 5,811,790 A | | 9/1998 | Endo et al. | 250/208.1 |
| 5,838,703 A | * | 11/1998 | Lebby et al. | 372/43 |
| 5,847,877 A | | 12/1998 | Imamura et al. | 359/566 |
| 5,850,276 A | * | 12/1998 | Ochi et al. | 349/158 |
| 5,867,266 A | * | 2/1999 | Craighead | 356/344 |
| 5,902,997 A | * | 5/1999 | Kropp | 359/619 |
| 5,973,844 A | * | 10/1999 | Burger | 359/622 |
| 6,096,155 A | * | 8/2000 | Harden et al. | 156/250 |
| 6,157,488 A | * | 12/2000 | Ishii | 359/569 |
| 6,649,008 B2 | * | 11/2003 | Feldman et al. | 156/250 |

FOREIGN PATENT DOCUMENTS

| EP | 1001301 A | * | 5/2000 | |
|---|---|---|---|---|
| JP | 58-157317 | | 9/1983 | |
| JP | 10-123388 | | 5/1988 | |
| JP | 63-172204 | | 7/1988 | |
| JP | 2-78901 | | 3/1990 | |
| JP | 2-143201 | | 6/1990 | 359/566 |
| JP | 3-250437 | | 11/1991 | 369/FOR 11 |
| JP | 9-127322 | | 5/1997 | |
| JP | 10-133149 | | 5/1998 | |
| JP | 11-44810 | | 2/1999 | |
| JP | 11-111606 A | * | 4/1999 | |
| WO | WO 99/ 38046 A1 | * | 7/1999 | |

OTHER PUBLICATIONS

International Lens Design Conference, Proceedings, International Society for Optical Engineering, vol. 1354, pp. 24–37, Jun. 11–14, 1990, Monterey, California.

* cited by examiner

Primary Examiner—John Juba, Jr.
(74) Attorney, Agent, or Firm—Fitzpatrick, Cella, Harper & Scinto

(57) ABSTRACT

An optical unit includes a first optical element and a second optical element, wherein the first optical element has a protrusion while the second optical element has a recess. The relative alignment between the first and second optical elements is accomplished by engagement of the protrusion and the recess.

71 Claims, 11 Drawing Sheets

OPTICAL UNIT HAVING PLURAL OPTICAL ELEMENTS

FIELD OF THE INVENTION AND RELATED ART

This invention relates to an optical unit having an optical element such as a diffractive optical element, for example, and, more particularly, to an optical unit suitably usable in manufacture of a microdevice such as an IC or LSI, for example.

Semiconductor device manufacturing technology has recently been advanced remarkably and, in this trend, microprocessing techniques have been developed significantly. For microprocessing, reduction projection exposure apparatuses having a resolving power of submicron order and being called steppers are mainly used. For further improvement of resolution, enlargement of the numerical aperture (NA) of an optical system, shortening of exposure wavelength or introduction of a novel optical element has been attempted.

It has been proposed that a plurality of optical elements, each being such as a diffraction element (diffractive optical element) to be used for correction of chromatic aberration, for example, are used in an exposure apparatus.

Where diffractive optical elements are to be bonded with each other, the optical performance may be deteriorated unless they are relatively positioned with good precision.

SUMMARY OF THE INVENTION

It is an object of the present invention to provide an optical unit having desired optical performance, wherein diffractive optical elements are relatively positioned with good precision and are bonded with each other.

In accordance with an aspect of the present invention, there is provided an optical unit, comprising: a first optical element; and a second optical element; wherein said first optical element has a protrusion while said second optical element has a recess; and wherein the relative alignment between said first and second optical elements is accomplished by engagement of the protrusion and the recess.

Each of the first and second optical elements may comprise a diffractive element for diffracting a light ray incident thereon, at a predetermined deflection angle.

The diffractive element may comprise a diffraction grating (binary grating) having a step-like shape along an optical axis direction or a diffraction grating of Kinoform shape.

In accordance with another aspect of the present invention, there is provided an optical unit, comprising: a first diffractive element; and a second diffractive element; wherein said first diffractive element has a protrusion while said second diffractive element has a recess; wherein the relative alignment between said first and second diffractive elements is accomplished by engagement of the protrusion and the recess; and wherein each of said first and second diffractive elements comprises a diffraction grating having a step-like shape along an optical axis direction or a diffraction grating of blazed shape.

In one preferred form of these aspects of the present invention, the protrusion and the recess are formed at diffraction grating surfaces of said first and second diffractive elements.

The protrusion and the recess may be formed outside diffraction grating surfaces of said first and second diffractive elements.

The protrusion and the recess may be formed at centers of said first and second diffractive elements, respectively.

The first and second diffractive elements may have a plurality of protrusions and a plurality of recesses formed at positions corresponding to the protrusions.

The first and second optical elements may be bonded with each other with a predetermined spacing maintained therebetween, wherein, with respect to the spacing, the difference between an optical path length of a light ray passing through the protrusion and an optical path length of a light ray passing through a portion other than the protrusion may correspond to a multiple, by an integral number, of the wavelength of the light ray.

The first and second diffractive elements may be made of different mediums, wherein a space may be defined between a free end of the protrusion and a bottom of the recess, and wherein an optical path length as defined by a structure of the space, the protrusion and the recess may correspond to a multiple, by an integral number, of the wavelength of a light ray passing therethrough.

In accordance with a further aspect of the present invention, there is provided a method of manufacturing an optical unit, comprising the steps of: selectively removing a predetermined region on a first substrate to produce a step-like shape on the surface of the first substrate, while forming at least one recess upon the surface thereof; selectively removing a predetermined region on a second substrate to produce a step-like shape on the surface of the second substrate, while forming a protrusion upon the surface thereof; and engaging the recess and the protrusion so as to relatively position the first and second substrates, and adhering the first and second substrates with each other.

In one preferred form of this aspect of the present invention, the first and second substrates are made of different mediums, wherein the height of the protrusion is smaller than the depth of the recess.

In accordance with a further aspect of the present invention, there is provided an optical system which comprises an optical unit as recited above, and a lens.

In accordance with a yet further aspect of the present invention, there is provided an exposure apparatus having an optical system as above, for projecting and printing a mask pattern onto a surface to be exposed.

In accordance with a still further aspect of the present invention, there is provided a device manufacturing method, comprising the steps of: exposing a workpiece having a photosensitive material applied thereto, with a device pattern and by use of an exposure apparatus as recited above; and developing the exposed workpiece.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.

Figure 1:
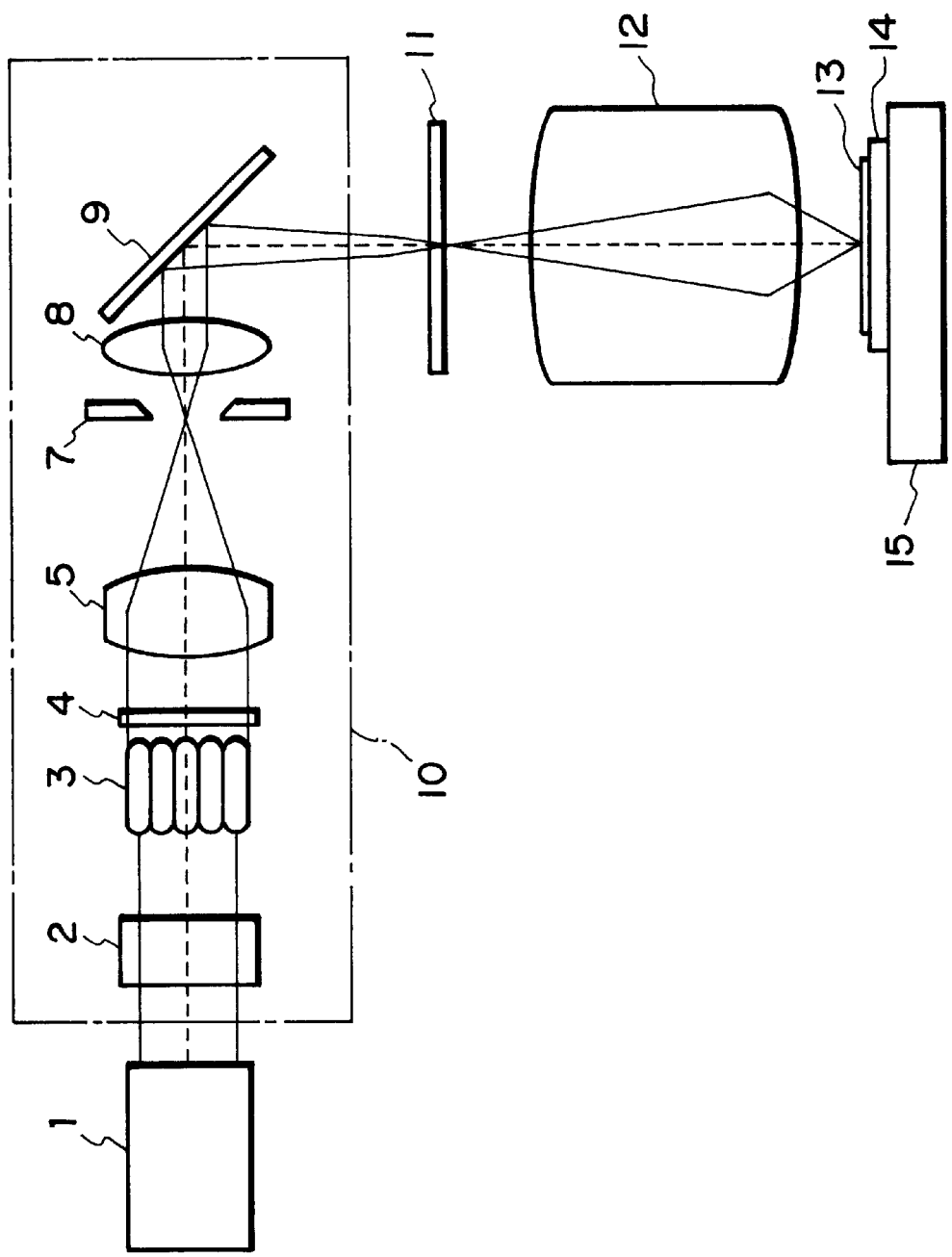
FIG. 1 is a schematic view of a general structure of a stepper according to a first embodiment of the present invention.
Figure 2:
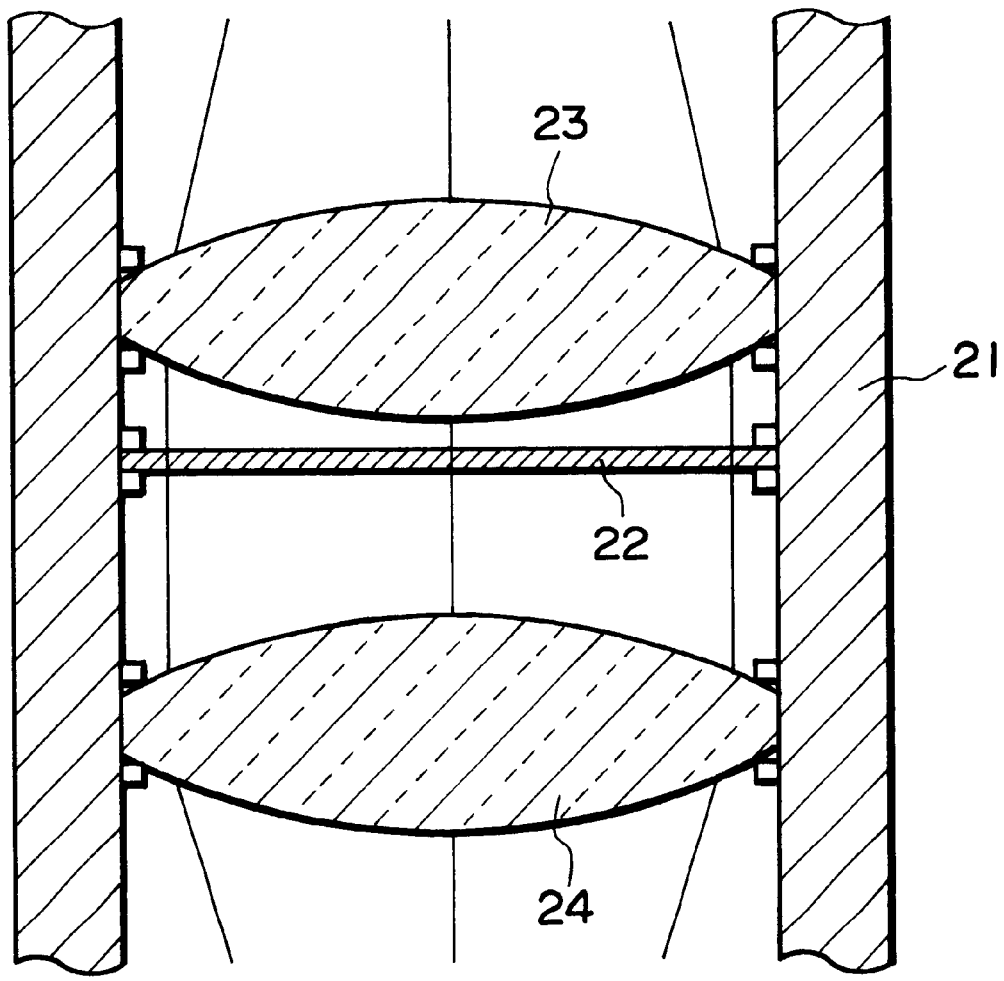
FIG. 2 is a schematic and sectional view of a portion of a reduction optical system according to the first embodiment of the present invention.
Figure 3:
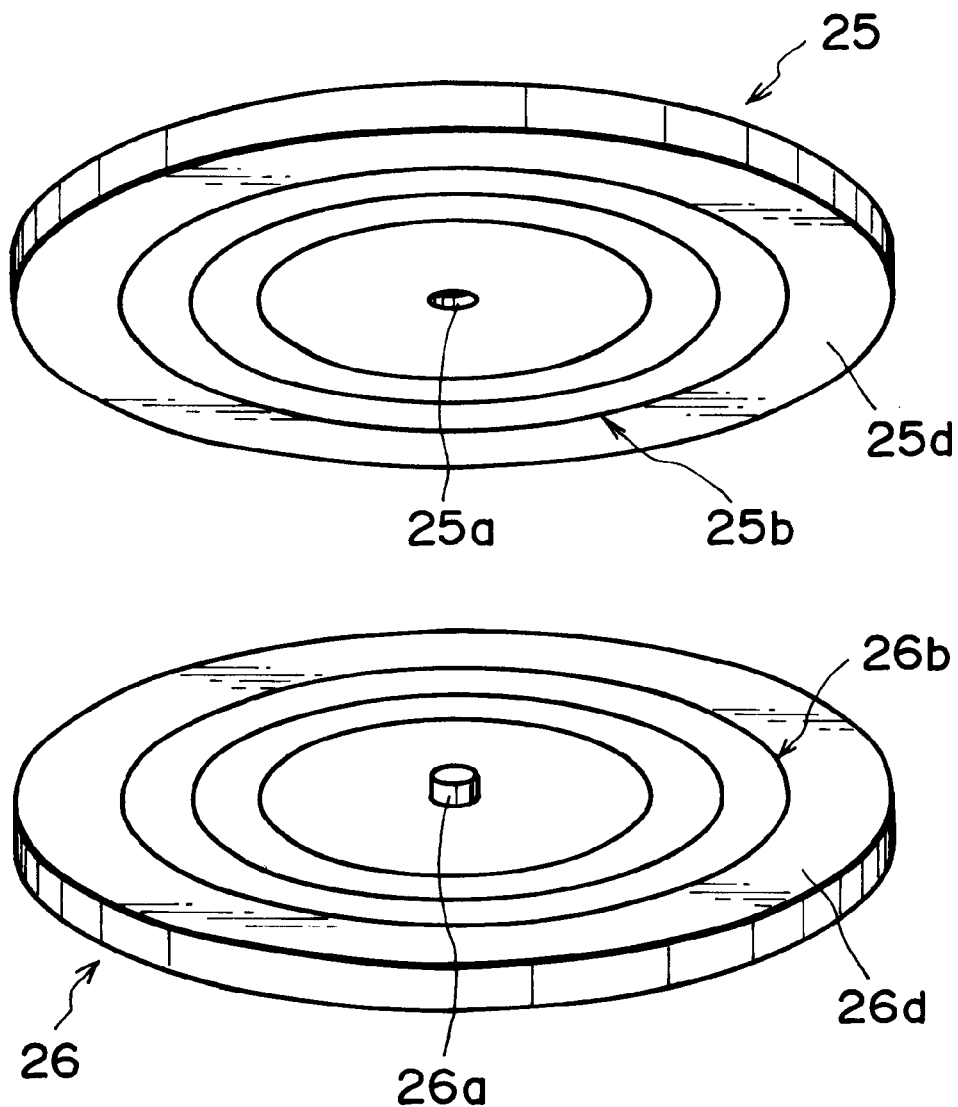
FIG. 3 is an exploded and perspective view of an optical unit according to the first embodiment of the present invention.
Figure 4A:
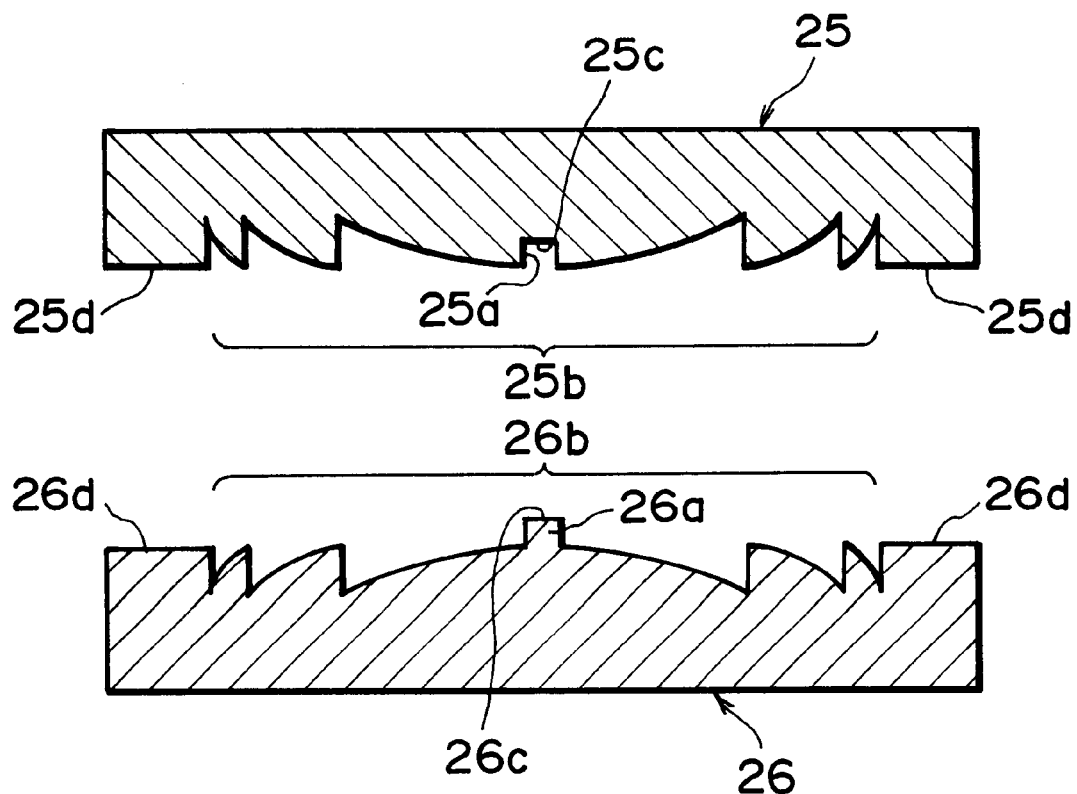
FIGS. 4A and 4B are schematic and sectional views of an optical unit according to the first embodiment of the present invention.
Figure 4B:
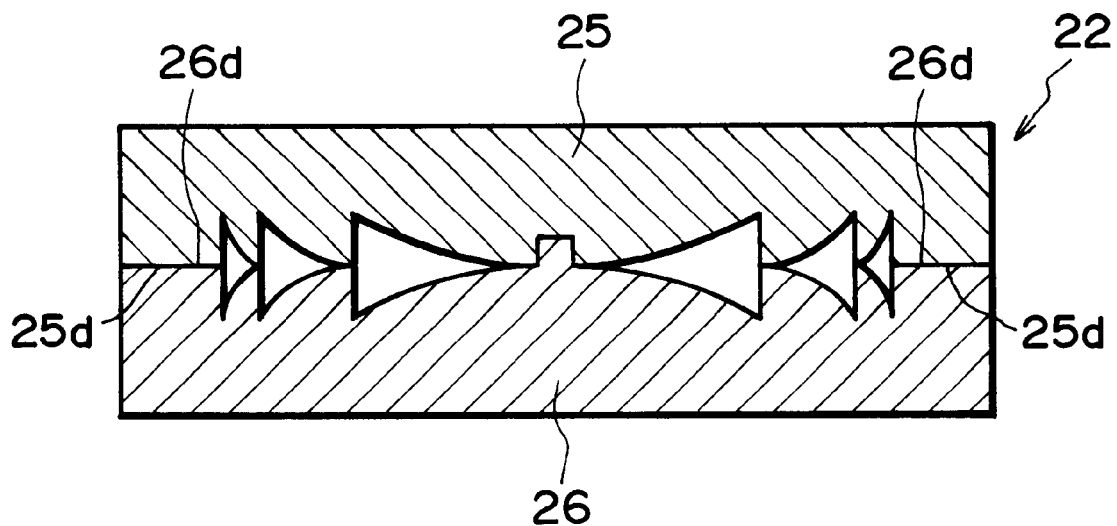

FIG. 1 is a schematic view of a general structure of a stepper (reduction projection exposure apparatus) having an optical unit according to a first embodiment of the present invention. FIG. 2 is a schematic and sectional view of a portion of a projection optical system in the stepper of FIG. 1. FIG. 3 is an exploded and perspective view of an optical unit in the optical system of FIG. 2. FIGS. 4A and 4B are schematic and sectional views of the optical unit in the optical system of FIG. 2, in a section containing the optical axis.

The first embodiment will be described in detail, FIG. 1 is a schematic view which shows a major structure of the stepper of the first embodiment. The stepper comprises an illumination optical system 10 for projecting an illumination light to a reticle 11 having a circuit pattern formed thereon, and a projection optical system 12 for projecting the pattern of the reticle 11 onto the surface of a wafer 13 in a reduced scale, by use of the light passing through the reticle 11. The stepper further comprises a wafer chuck 14 on which the wafer 13 is placed and held fixed, and a wafer stage 15 on which the wafer chuck 14 is fixedly mounted.

The optical system described above comprises a light source 1 for emitting illumination light of short-wavelength, such as ultraviolet light or deep ultraviolet light (in this embodiment, high-luminance ArF excimer laser light), and beam shape changing means 2 for transforming the illumination light from the light source 1 into a desired beam shape. It further comprises an optical integrator 3 having a plurality of cylindrical lenses or small lenses disposed two-dimensionally, and a stop member 4 having interchangeable stops which can be selectively interchanged by using interchanging means (not shown), and being disposed adjacent to the position of secondary light sources as produced by the optical integrator 3. The optical system further comprises a condenser lens 5 for collecting the illumination light passed through the stop member 4, and a blind 7 having four movable blades, for example, and being disposed at a conjugate plane of the reticle 11 to determine a desired illumination range on the reticle 11 surface. It further comprises an imaging lens 8 for projecting the illumination light having been determined by the blind 7 into a predetermined shape, and a deflection mirror 9 for reflecting the illumination light, from the imaging lens 9, toward the reticle 11 direction.

The operation for projecting, in reduced scale, the pattern of the reticle 11 onto the wafer 13 surface by using the stepper of the structure described above will be explained.

First, the illumination light emitted from the light source 1 is transformed by the beam shape changing means 2 into a predetermined shape and, after this, it is projected onto the optical integrator 3. In response, adjacent to the light exit surface of the integrator, a plurality of secondary light sources are produced. The illumination light from these secondary light sources pass through the stop member 4 and are collected by the condenser lens 5. Then, after being defined into a predetermined shape by means of the blind 7, the light is transmitted through the imaging lens 8 and is reflected by the deflection mirror 9. Subsequently, the light passes the pattern of the reticle 11 and it enters the projection optical system 12. The light passes through the projection optical system 12, by which the reticle pattern is projected upon the surface of the wafer 11 while being reduced to a predetermined size. The wafer exposure is thus performed.

The structure of the projection optical system 12 having an optical unit 22 according to the first embodiment will be described below. FIG. 2 is a sectional view of a portion of the projection optical system 12 of FIG. 1. There is an optical unit 22 fixedly mounted inside a barrel 21. Also, there are lenses 23 and 24 fixedly disposed above and below the optical unit 22.

The optical unit 22 comprises a unit having a function equivalent to a combination of plural lenses, and it serves to reduce aberration of the projection optical system 12, particularly, chromatic aberration thereof.

Namely, with the insertion of the optical unit 22 into the projection optical system 12, production of aberration can be reduced to a minimum while using a decreased number of optical lenses of the projection optical system 12.

FIG. 3 is an exploded perspective view of the optical unit 22. The optical unit 22 comprises a first diffractive optical element 25 and a second diffractive optical element 26. Upon one side of each of the first and second diffractive optical elements 25 and 26, a diffraction grating surface 25b or 26b is formed. The first and second diffractive optical elements are disposed so that their diffraction grating surfaces 25a and 26a face each other.

Each of the first and second diffractive optical elements 25 and 26 comprises a binary type optical element with a diffraction grating surface 25b or 26b which can be produced by forming small surface steps (level differences) upon a raw material substrate, mainly containing quartz. Through the function of these small surface steps, the diffractive optical element operates to diffract a light beam incident thereon, at a desired deflection angle.

Figure 6:
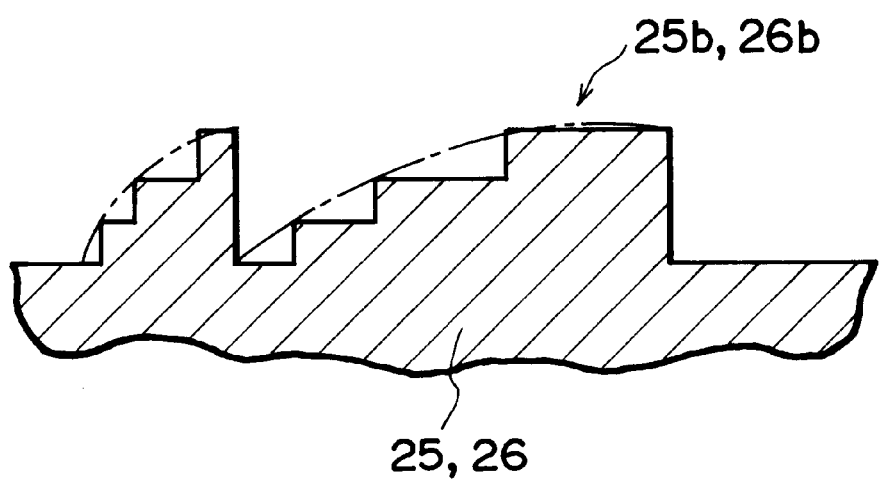
FIG. 6 is a schematic and sectional view for explaining details of a diffractive optical element according to the first embodiment of the present invention.

The first and second diffractive optical elements 25 and 26 can be produced by microprocessing a raw material substrate, mainly consisting of quartz, on the basis of a photolithographic process and a dry etching process, used in the semiconductor manufacturing procedure. It is formed into such shape that an idealistic element shape (blazed shape or Kinoform) as depicted by broken lines in FIG. 6 is approximated by a step-like shape. Here, the height (level difference) of each individual step in the step-like section is about 40–60 nm.

A diffraction pattern on the diffraction grating surface 25b or 26b can be produced by patterning the surface of a disk-like substrate on the basis of photolithography and dry etching. In order to provide a diffraction pattern with a step-like shape, such as is shown in FIG. 6, a number of patterning operations corresponding to the number of surface steps are necessary. When a diffraction pattern with four steps (levels) such as shown in FIG. 6 is to be produced, two patterning operations are necessary. Here, if a disk-like substrate which is a raw material substrate for the diffractive optical element 25 or 26 is relatively large in size, the whole range may not be exposed through a single exposure operation. Thus, the element surface may be divided concentrically into plural zones, and two patterning operations may be performed with respect to each of the zones.

FIGS. 4E and 4D are sectional views of the first and second diffractive optical elements 25 and 26, along a section containing an optical axis. The optical unit of the first embodiment comprises first and second diffractive optical elements 25 ands 26 (FIG. 4A) which are bonded with each other with their diffraction grating surfaces 25a and 26a opposed to each other (FIG. 4B).

By bonding the diffraction grating surfaces 25b and 26b with each other while putting them face to face with each other, creation of scratches on the diffraction grating surfaces 25b and 26b can be avoided. Further, adhesion of particles or any organic materials to these surfaces can be prevented.

Further, by bonding the first and second diffractive optical elements 25 and 26 into an integral structure, the function of the optical unit 22 can be divided into those of the diffraction grating surfaces 25b and 26b of the first and second diffractive optical elements 25 and 26. Therefore, the pitches of the diffraction grating surfaces 25b and 26b can be made relatively coarse and, thus, their shape can be simplified. This enables a reduction in the number of etching operations required, for example, and it accomplishes simplification of the manufacturing procedure.

As shown in FIGS. 3, 4A and 4B, there is a recess 25a formed on the diffraction grating surface 25b of the first diffractive optical element 25 at the central optical axis position, and also there is a protrusion 26a formed on the diffraction grating surface 26b of the second diffractive optical element 26 at the central optical axis position. The recess 25a and protrusion 26a are formed with a width (diameter) of about 10 microns. Also, they are so formed that the depth of the recess 25a and the height (protruded quantity) of the protrusion 26a are equal to each other.

Figure 5:
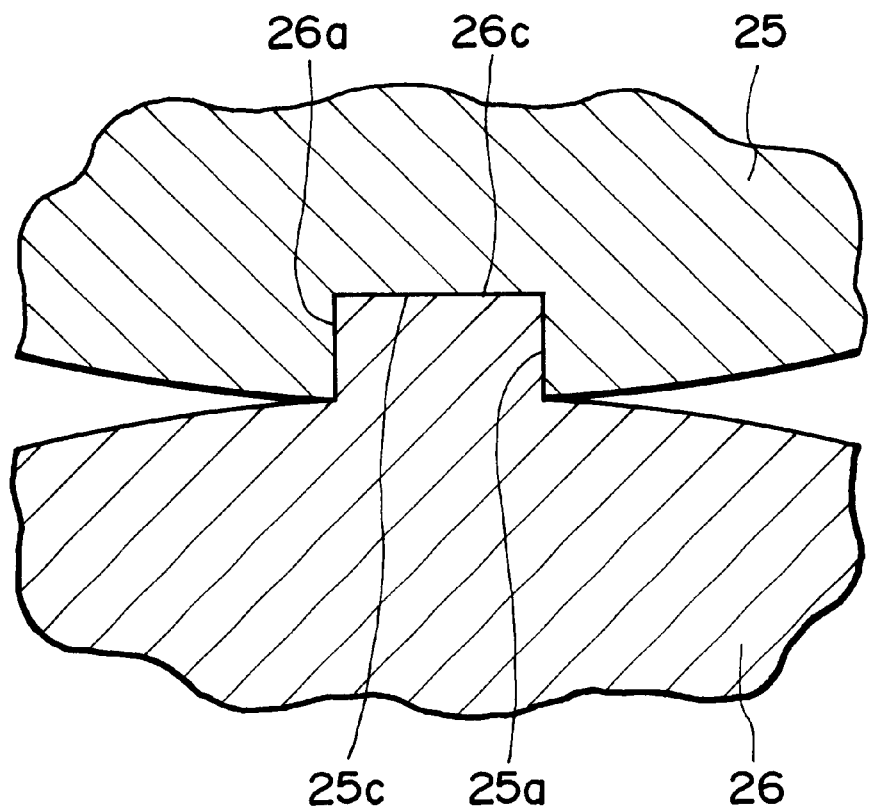
FIG. 5 is a sectional view for explaining an engagement portion of diffractive optical elements, constituting an optical unit according to the first embodiment of the present invention.

By connecting the first and second diffractive optical elements 25 and 26 with each other as shown in FIG. 4B, the recess 25a and the protrusion 26a engage with each other. FIG. 5 is a sectional view, illustrating in enlargement the state of engagement between the recess 25a and the protrusion 26a. By engaging the recess 25a and the protrusion 26a with each other in this manner, the relative positioning of the first and second diffractive optical element 25 and 26 with each other, with respect to a direction perpendicular to the optical axis, can be effected surely.

The diffraction grating surfaces 25b and 26b of the first and second diffractive optical elements 25 and 26 are each formed revolutionally symmetrically with respect to the optical axis. Therefore, with the provision of the recess 25a and the protrusion 26a each at a single location on the optical axis position, the positioning with respect to a direction perpendicular to the optical axis can be effected stably.

The first and second diffractive optical elements 25 and 26 are made of the same medium having the same refractive index. By making the depth of the recess 25a and the height of the protrusion 26a equal to each other, when the recess 25a and the protrusion 26a are engaged as shown in FIG. 5, the bottom 25c of the recess 25a contacts the top face 26c of the protrusion 26a. With this arrangement, the recess 25a and the protrusion 26b can be made into a completely integral structure of the same medium. Further, since the recess 25a and the protrusion 26a are formed in a very small shape of a width of about 10 microns, substantially no adverse influence is applied to light rays passing through this portion of the diffractive optical element.

Since, as described, the diffraction grating surfaces 25b and 26b of the first and second diffractive optical elements 25 and 26 are produced in accordance with photolithography and dry etching, the recess 25a and the protrusion 26a can be formed simultaneously with the formation of the diffraction grating surfaces 25b and 26b. Therefore, the relative position between the diffraction pattern on the diffraction grating surface 25b or 26b and the recess 25a or the protrusion 26a can be determined with very high precision. Further, since the recess 25a and the protrusion 26a can be formed simultaneously with the diffraction grating surfaces 25b and 26b, there is no necessity of adding a specific process or processes for forming them. Here, it is to be noted that the protrusion 25a may be formed by deposition, for example, an ordinary CVD (Chemical Vapor Deposition) process used in the semiconductor device manufacturing processes.

After the first and second diffractive optical elements 25 and 26 are brought into alignment with each other on the basis of the recess 25a and the protrusion 26a, an adhesive agent may be applied to peripheral portions 25d and 26d, for example, and they are bonded with each other. By this bonding, they are connected into an integral structure. As an alternative, the surface precision of the surfaces at the peripheral portions 25d and 26d of the first and second diffractive optical elements 25 and 26 may be refined, and then they are brought into intimate contact with each other. Thus, they can be bonded to each other through optical contact.

Since the recess 25a and the protrusion 26a are formed at the centers or optical axis positions on the first and second diffractive optical elements 25 and 26, respectively, as described above, they may he used as a reference for alignment or registration with respect to the apparatus, during a process wherein the diffraction grating surfaces 25b and 26b are to be formed upon the first and second diffractive optical elements 25 and 26 or during any other process. In that case, the depth of the recess 25a may be set to be equal to a multiple, by an integral number, of the wavelength $\lambda$ of light passing through the optical unit 22. With this arrangement, any optical influence which might be caused due to the shape of the recess 25a or protrusion 26a, in the alignment operation, can be suppressed.

In accordance with the first embodiment of the present invention as described hereinbefore, the optical unit 22 is formed of first and second diffractive optical elements 25 and 26, and, when they are bonded to each other, the recess 25a formed on the first diffractive optical element 25 and the protrusion 26a formed on the second diffractive optical element 26 are engaged with each other to complete their positioning. As a result, any relative positional deviation between the first and second diffractive optical elements 25 and 26 in a direction perpendicular to the optical axis can be prevented. Therefore, any deterioration of the optical performance when they are bonded with each other into an integral optical unit 22 can be kept to a minimum. Thus, an optical unit having a desired performance can be accomplished.

Further, by bonding the first and second diffractive optical elements 25 and 26 into an integral structure, the function of the optical unit 22 can be divided into those of the diffraction grating surfaces 25b and 26b of the first and second diffractive optical elements 25 and 26. Therefore, the pitches of the diffraction grating surfaces 25b and 26b can be made relatively coarse and, thus, their shape can be simplified. This enables a reduction in the number of etching operations required, for example, and accomplishes simplification of the manufacturing procedure.

By bonding the diffraction grating surfaces 25b and 26b with each other while putting them face to face with each other, these surfaces can be protected satisfactorily, and adhesion of particles or any organic materials to these surfaces can be prevented.

Additionally, since the recess 25a and the protrusion 26a can be formed simultaneously with the process for forming the diffraction grating surfaces 25b and 26b, they can be produced together with the diffraction patterns of the diffraction grating surfaces 25b and 26b without complicating the procedure.

In the embodiments described above, a gas may be sealingly introduced into the space between the first and second diffractive optical elements 25 and 26. In that case, by setting the gas material and/or the gas pressure sealingly introduced into the space 27. appropriately as well as by setting the wavelength of the light source of the stepper appropriately, effective diffraction of light can be accomplished. For this case, an inert gas such as neon (Ne) or nitrogen ($N_2$), for example, may be selected in accordance with the wavelength of light from the light source 1.

Figure 7:
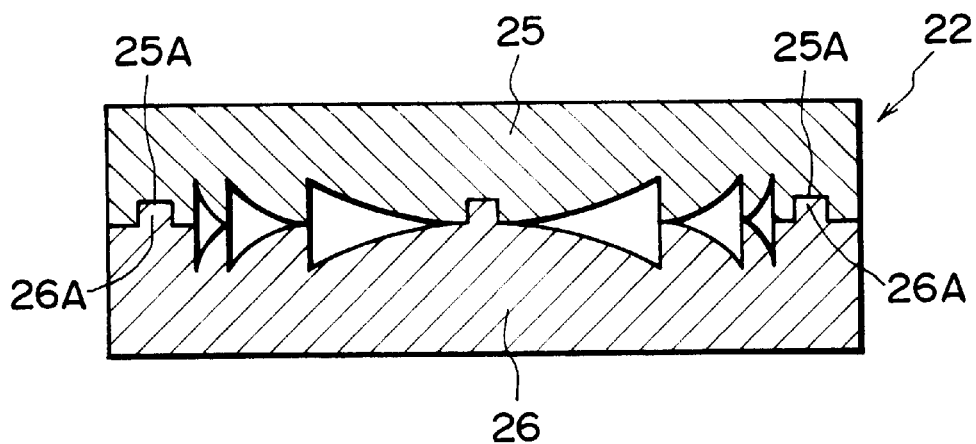
FIG. 7 is a schematic and sectional view of another example of an optical unit according to the first embodiment of the present invention.

In the first embodiment described above, for more exact alignment, additional recesses 25A and protrusions 26A may be provided at the peripheral edge portions of the first and second diffractive optical elements 25 and 26 such as shown in FIG. 7. Such recesses and protrusions can thus be formed without adverse influence to the performance of the optical unit.

Next, a second embodiment of the present invention will be described in conjunction with the drawings. Also in the second embodiment, description will be made of an example of a stepper having an optical unit according to the present invention.

Figure 8:
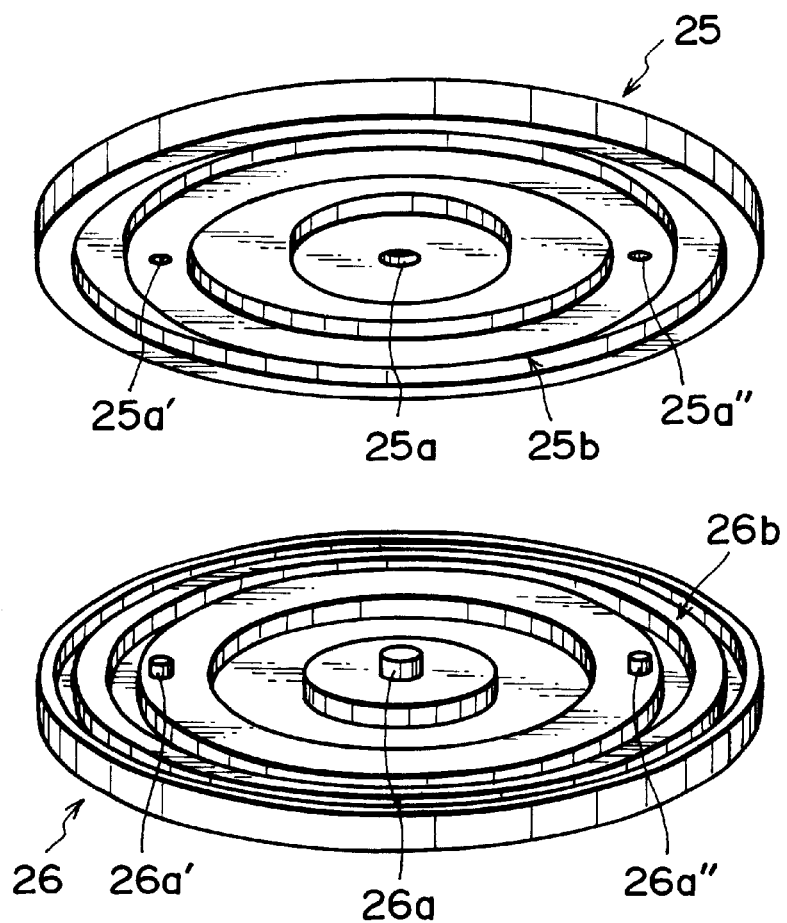
FIG. 8 is an exploded and perspective view of an optical unit according to a second embodiment of the present invention.

The majority of the structure of the stepper of the second embodiment is essentially the same as that of the stepper of the first embodiment, and, for this reason, description thereof will be omitted here. In FIGS. 8–10, which illustrate the second embodiment, the components substantially corresponding to those of the first embodiment are denoted with like numerals.

The optical unit 22 of the second embodiment comprises, as in the first embodiment, two diffractive optical elements bonded to each other. The second embodiment differs from the first embodiment in that these two diffractive optical elements are made of different mediums, and that there are plural recesses and protrusions for the positioning, which are formed at plural locations.

FIG. 8 is an exploded perspective view of the optical unit 22. Like the first embodiment, the optical unit 22 is provided with a first diffractive optical element 25 and a second diffractive optical element 26. Upon one side of each of the first and second diffractive optical elements 25 and 26, a diffraction grating surface 25b or 26b is formed. These diffraction grating surfaces 25b and 26b are disposed to be opposed to each other.

Figure 9A:
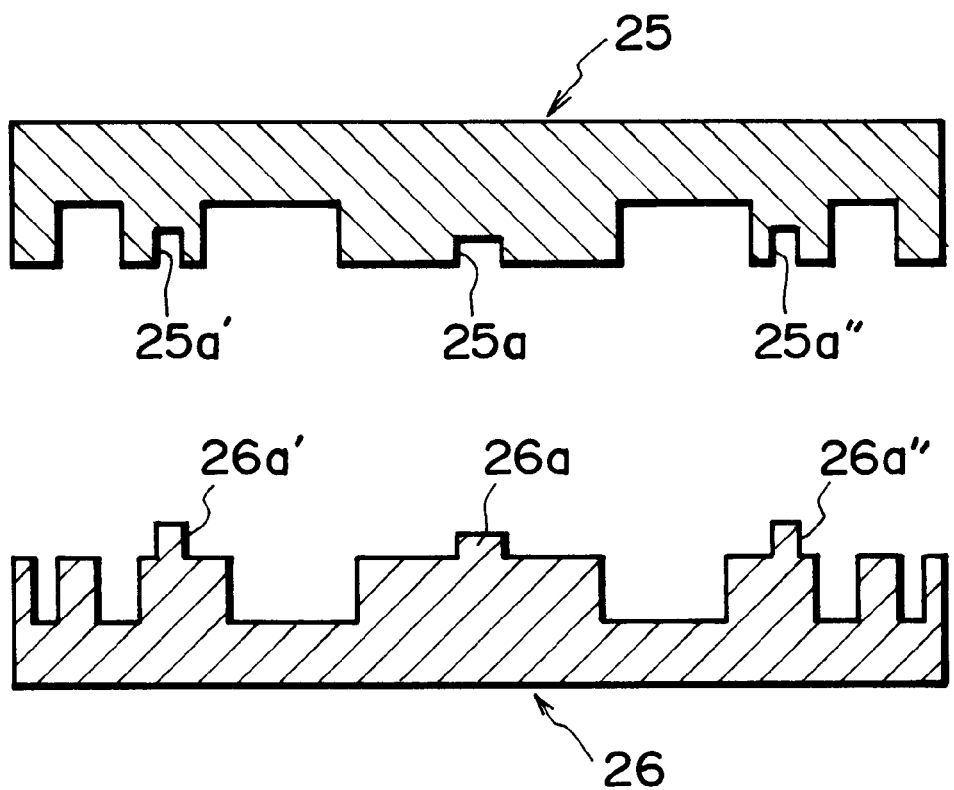
FIGS. 9A and 9B are schematic and sectional views of an optical unit according to the second embodiment of the present invention.
Figure 9B:
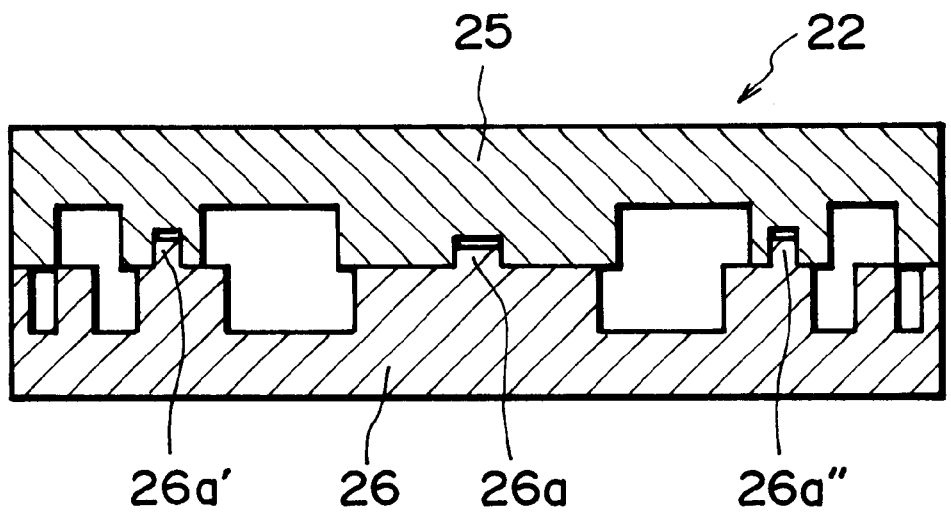
Figure 10:
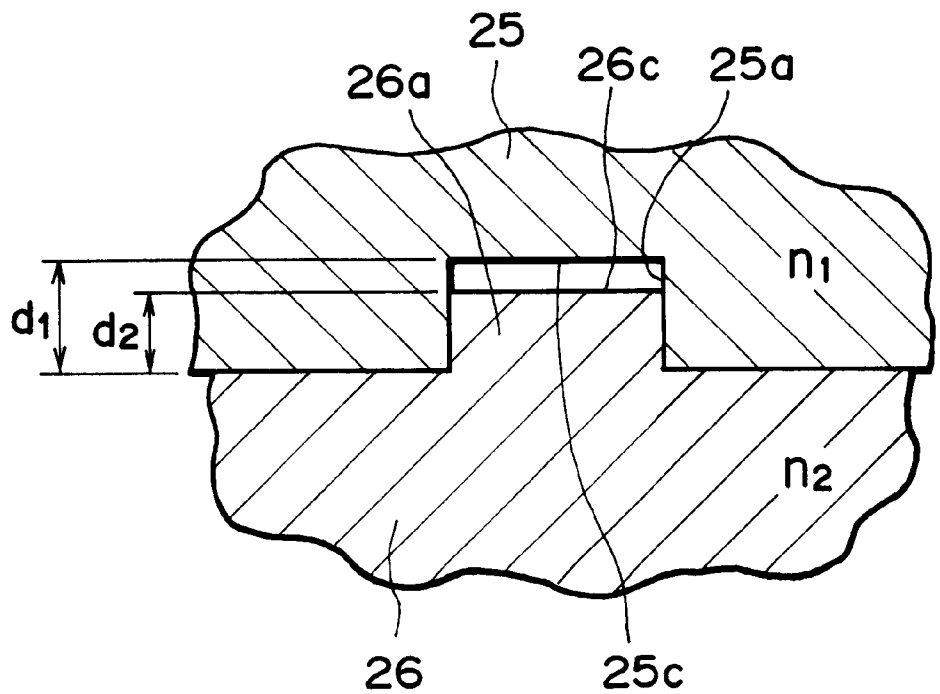
FIG. 10 is a sectional view of an engagement portion of diffractive optical elements, constituting an optical unit according to the second embodiment of the present invention.

FIGS. 9A and 9B are sectional views of the first and second diffractive optical elements 25 and 26 of the second embodiment, along a section containing the optical axis. Like the first embodiment, the optical unit 22 is produced by bonding the first and second diffractive optical elements 25 and 26 (FIG. 9A) to each other while putting their diffraction grating surfaces 25a and 26b face to face with each other (FIG. 9B).

As compared with the diffractive optical elements of the first embodiment, the first and second diffractive optical elements 25 and 26 of the second embodiment are each formed revolutionally asymmetrically with respect to the optical axis. However, as regards X and Y directions in a plane coordinate system orthogonal to the optical axis, they are formed with diffraction patterns being symmetric with respect to the X axis and the Y axis, respectively. The first diffractive optical element 25 of the second embodiment is provided with a plurality of recesses 25a, 25a' and 25a". On the other hand, the second diffractive optical element 26 is provided with protrusions 26a, 26a' and 26a" at predetermined positions thereon corresponding to the positions of the recesses 25a, 25a' and 25a", respectively. As the first and second diffractive optical elements 25 and 26 are bonded to each other, as shown in FIG. 9B, recesses 25a, 25a' and 25a" engage with the protrusions 26a, 26a' and 26", respectively. With the provision of at least two recesses and protrusions on the diffractive optical elements, as described, the diffractive optical elements can be aligned with each other exactly even though the diffraction patterns formed on the diffraction grating surfaces 25b and 26b are not revolutionally symmetric with respect to the optical axis.

Where the first and second diffractive optical elements 25 and 26 of the second embodiment are binary type diffractive optical elements, a portion of each of the diffraction grating surfaces 25b and 26b will be formed flat. Such flat surface portion may be used, and the recesses 25a, 25a' and 25a" or the protrusions 26a, 26a' and 26a" may be formed upon the diffraction grating surface 25b or 26b other than the optical axis position. In that case, the position range for forming the recesses 25a, 25a' and 25a" or the protrusions 26a, 26a' and 26a" can be enlarged. Further, by providing the recesses 25a, 25a' and 25a" and the protrusions 26a, 26a' and 26a" upon flat surface portions, the closeness of contact between them is improved and, therefore, the relative positioning can be effected more exactly.

The number and positions of the recesses 25a, 25a' and 25a" and of the protrusions 26a, 26a' and 26a" may be set appropriately, in accordance with the optical performance as required for the optical unit 22.

The second diffractive optical element 26 of the second embodiment is made of a medium different from that of the first diffractive optical element 25. Thus, as light passes through the first and second diffractive optical elements 25 and 26, they show different refractive indices.

By using different materials in production of the optical unit 22 so that the first and second diffractive optical elements 25 and 26 provide different refractive indices, the function of the optical unit 22 can be dispersed into the first and second diffractive optical elements 25 and 26 more effectively. As a result, the tolerance range for the optical performance of the optical unit 22 can be enlarged, and further improvement of the optical performance of the optical unit 22 is accomplished.

FIG. 10 is a sectional view, showing in enlargement the state of engagement between a recess 25a and a protrusion 26a when the first and second diffractive optical elements 25 and 26 are bonded to each other. Generally, since the recess 25a and the protrusion 26a are formed in a very small shape of a width of about 10 microns or less, only a very small influence is applied to light rays passing through this portion of the diffractive optical element. Although it can be disregarded, where the first and second diffractive optical elements 25 and 26 are made of different mediums as in the second embodiment, the depth of the recess 25a and the height (protruded amount) of the protrusion 26a may be so set that a clearance is produced between the bottom 25c of the recess 25a and the top face 26c of the protrusion 26a.

In that case, the following relation should desirably be satisfied at the engagement portion between the recess 25 and the protrusion 26a:

$$n_1 \times d_1 - \{n_2 \times d_2 + n_3 \times (d_1 - d_2)\} = m\lambda$$

where $n_1$ is the refractive index of the first diffractive optical element 25, $n_2$ is the refractive index of the second diffractive optical element 26, $n_3$ is the refractive index of the medium which occupies the clearance between the recess 25a and the protrusion 26a, $d_1$ is the depth of the recess 25a, $d_2$ is the height (protruded amount) of the protrusion 26a, $\lambda$ is the center wavelength being used, and m is an integer. As regards $n_3$ among these factors, usually it may be $n_3 = 1$.

By setting the depth of the recess 25a and the height of the protrusion 26a in this manner, creation of a difference in optical path length at the recess 25a and the protrusion 26a, as the light passes the engagement portion, can be suppressed. Therefore, a decrease of illuminance as compared with light passing through a portion other than the engagement portion can be prevented. This is also the case with the engagement at recesses 25a' and 25a" and protrusions 26a' and 26a".

In accordance with the second embodiment of the present invention as described hereinbefore, for bonding the first and second diffractive optical elements 25 and 26 with each other to provide an integral structure of optical unit 22, there are recesses 25a, 25a' and 25a" and protrusions 26a, 26a' and 26a" formed at plural locations. With this arrangement, the alignment between the first and second diffractive optical elements 25 and 26, where their diffraction grating surfaces 25b and 26b are formed asymmetrically with respect to the optical axis, can be attained exactly. Thus, an optical unit 22 having a desired performance can be formed.

Further, by using different mediums for the first and second diffractive optical elements 25 and 26 to provide the optical unit 22, the optical function of the optical unit 22 can be dispersed into the first and second diffractive optical elements 25 and 26 more effectively. As a result, the optical performance of the optical unit 22 can be improved.

In the second embodiment, as has been described with reference to FIG. 7, some of the plural recesses and protrusions may be formed outside the diffraction grating surfaces 25b and 26b. This enables further reduction of the influence of the recess or protrusion on the optical performance of the optical unit 22.

Next, a third embodiment of the present invention will be described with reference to the drawings. Also in the third embodiment, description will be made of an example of a stepper having an optical unit according to the present invention.

The majority of the structure of the stepper of the third embodiment is essentially the same as that of the stepper of the first embodiment, and, for this reason, description thereof will be omitted here. In the drawings to be described in relation to the third embodiment, the components substantially corresponding to those of the first embodiment are denoted with like numerals.

Figure 11:
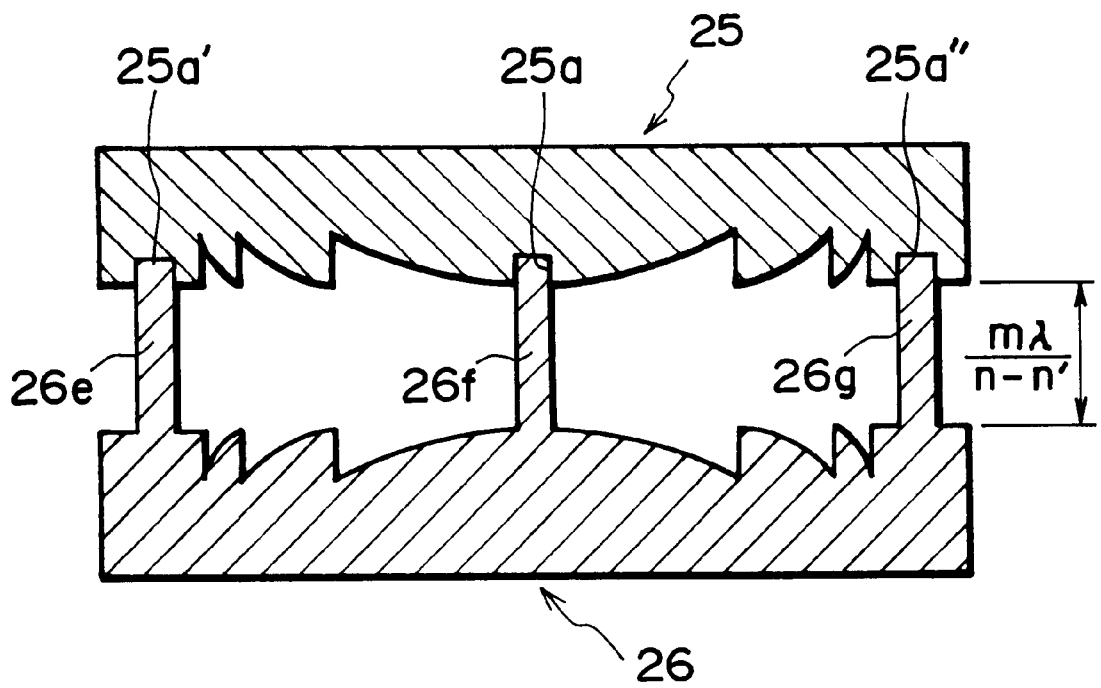
FIG. 11 is a schematic and sectional view of an optical unit according to a third embodiment of the present invention.

The optical unit 22 of the third embodiment comprises, as in the first embodiment, two diffractive optical elements, that is, a first diffractive optical element 25 and a second diffractive optical element 26. FIG. 11 is a sectional view of the first and second diffractive optical elements 25 and 26 in the second embodiment, along a section containing the optical axis. As illustrated, the third embodiment has a feature that the first and second diffractive optical elements 25 and 26 which form the optical unit 22 are spaced from each other by a predetermined distance.

Here, the positioning of the first and second diffractive optical elements 25 and 26 is accomplished by engagement between recesses 25a, 25a' and 25a" formed on the first diffractive optical element 25 and free ends of shaft portions 26e, 26f and 26g, which are formed integrally with the second diffractive optical element 26.

The shaft portions 26e, 26f and 26g may be formed by processing the same raw material of the second diffractive optical element 26, or alternatively, they may be formed as separate elements which may then be fixed integrally with the second diffractive optical element 26.

As shown in FIG. 11, the spacing between the first and second diffractive optical elements 25 and 26 may desirably be set so that the optical path length corresponds to a multiple (m$\lambda$), by an integer, of the wavelength of the light passing therethrough. More specifically, where n is the refractive index of the first and second diffractive optical elements 25 and 26 and n' is the refractive index of the medium occupying the space between them, the spacing should be equal to m$\lambda$/(n−n'). By setting the spacing between the first and second diffractive optical elements 25 and 26 in this manner, adverse influence upon the performance due to a change in optical path length at the engagement portion, as the light passes through the optical unit 22, can be prevented. Additionally, exact alignment between them is attainable.

In accordance with the third embodiment, as described above, the first and second diffractive optical elements 25 and 26 are held spaced from each other by a predetermined distance. With this arrangement, the optical performance selection range of the optical unit 22 can be expanded. Thus, an optical unit 22 of a desired performance can be accomplished.

In the first to third embodiments described above, the recess 25a and the protrusion 26a are formed at the optical axis position. However, provided that stable positioning can be attained by means of a recess or recesses and a protrusion or protrusions formed in other portions, it is not always necessary to provide them at the optical axis position.

Further, while in the first to third embodiments described above, the first and second diffractive optical elements 25 and 26 have diffraction grating surfaces 25b and 26b each being formed on one side of the corresponding optical element, both sides of the optical element may be provided with such grating surfaces.

Next, an embodiment of a semiconductor device manufacturing method which uses a stepper as described above will be explained.

Figure 12:
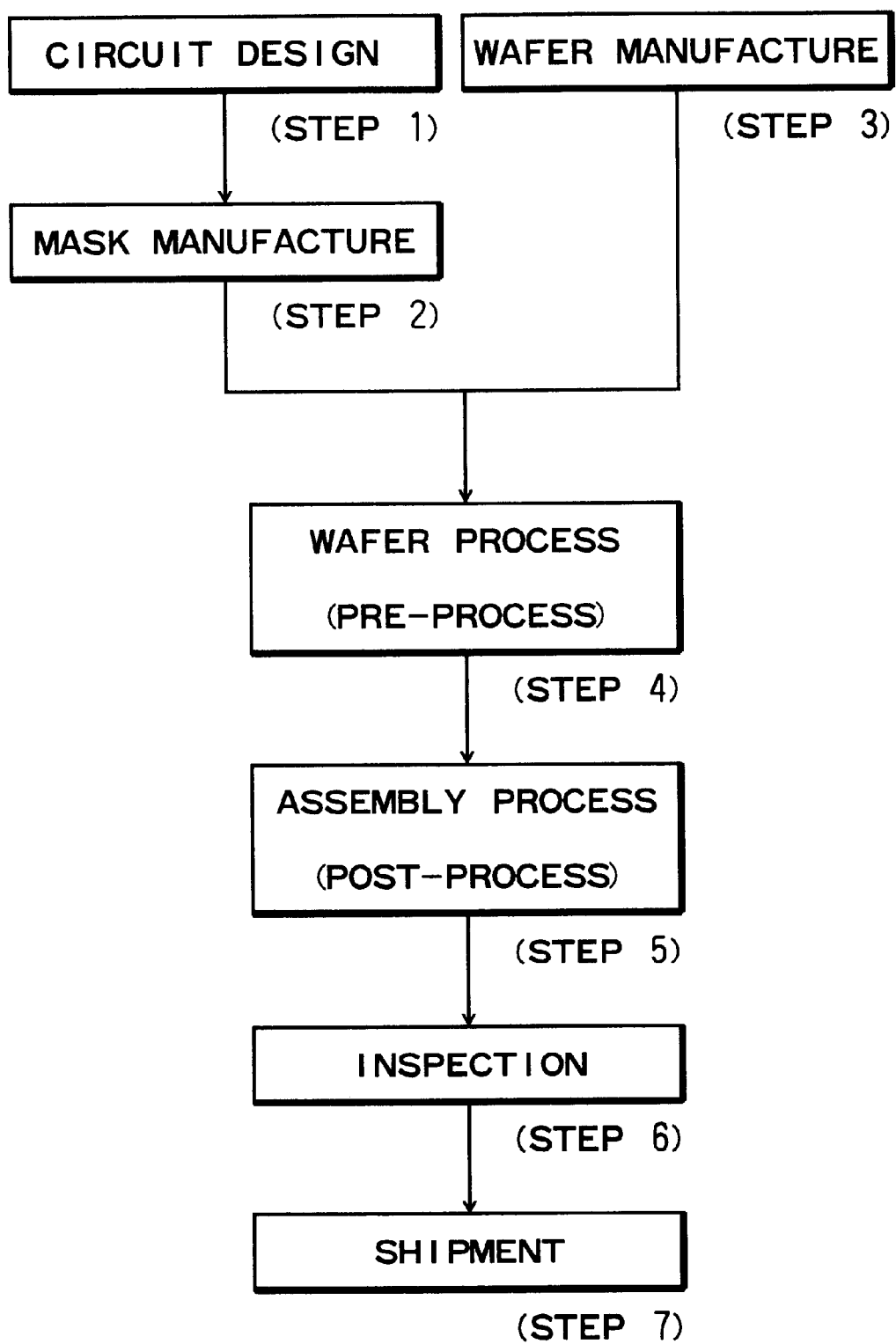
FIG. 12 is a flow chart of semiconductor device manufacturing processes using a stepper according to an embodiment of the present invention.

FIG. 12 is a flow chart of a procedure for manufacture of microdevices, such as semiconductor chips (e.g. ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so-prepared mask and wafer, circuits are practically formed on the wafer through lithography. Step 5 subsequent to this is an assembling step (called a post-process) wherein the wafer having been processed in step 4 is formed into semiconductor chips. This step includes an assembling (dicing and bonding) process and a packaging (chip sealing) process. Step 6 is an inspection step wherein an operation check, a durability check and so on for the semiconductor devices provided by step 5 are carried out. With these processes, semiconductor devices are completed and they are shipped (step 7).

Figure 13:
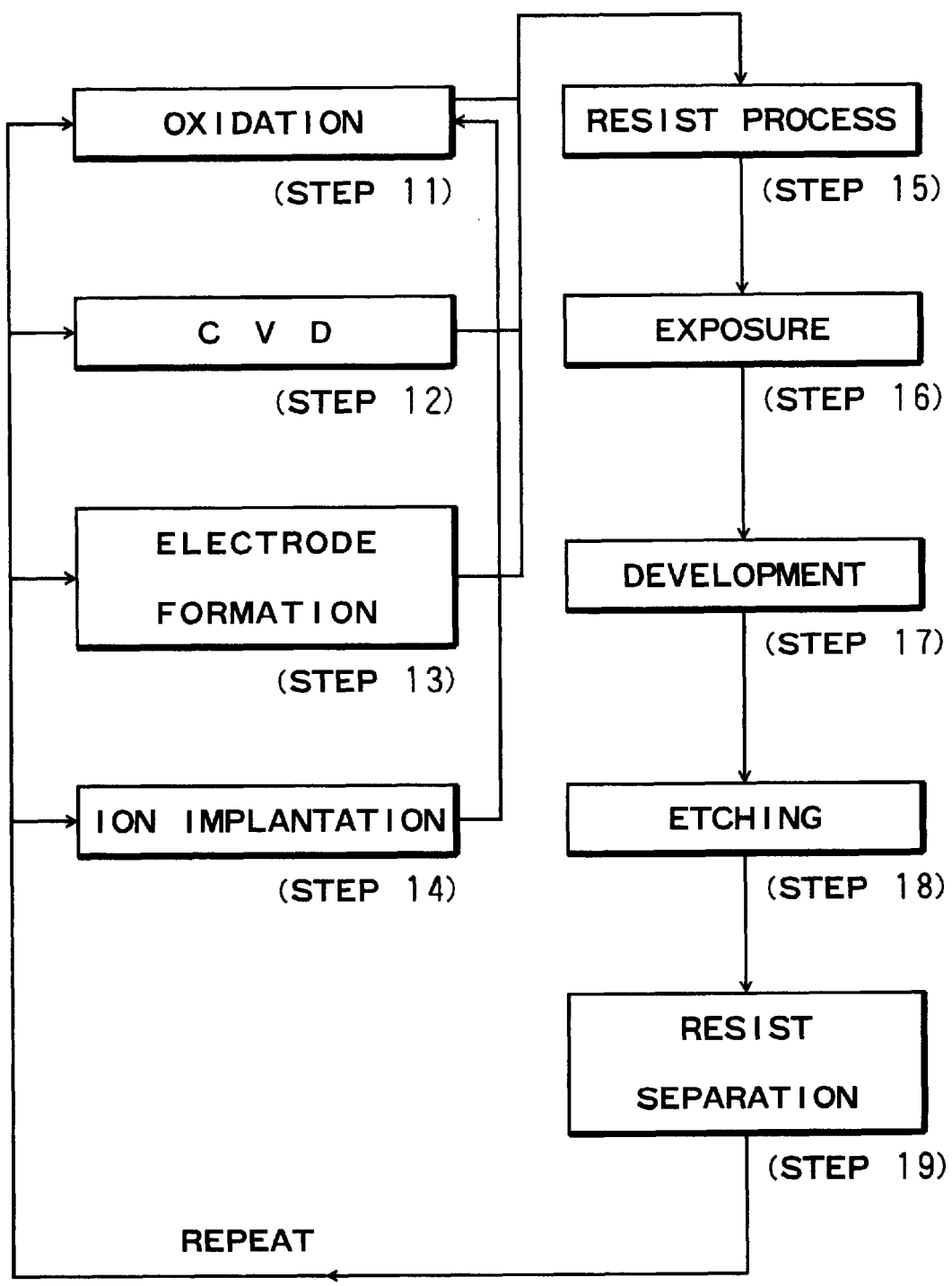
FIG. 13 is a flow chart for explaining details of a wafer process included in the procedure of FIG. 12.

FIG. 13 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions in the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

Where this manufacturing method is used, at step 16, uniform illumination light having various optical aberrations corrected can be projected to the wafer surface, with use of the stepper according to this embodiment of the present invention and with a large latitude. Therefore, a large-integration semiconductor device can be produced easily and stably. Here, it is to be noted that this manufacturing method may be used for the diffractive optical element 25 itself, not only for production of a semiconductor device.

While the first to third embodiments have been described with reference to examples of a stepper as an optical instrument having an optical unit 22, the present invention is not limited to this. For example, as shown in FIG. 14, an optical unit may be used in a portion of lenses constituting a television camera.

Figure 14:
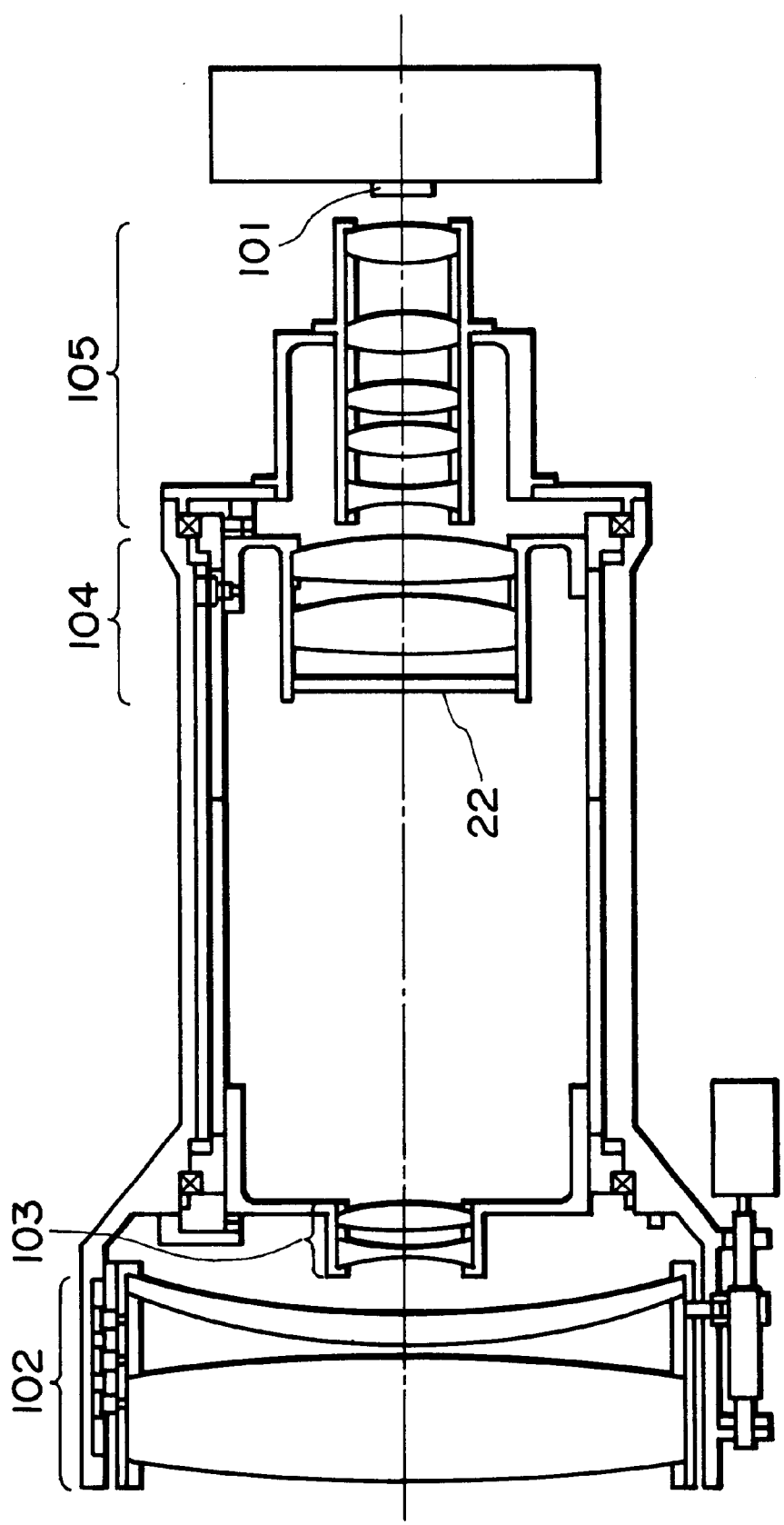
FIG. 14 is a schematic and sectional view of a television camera according to an embodiment of the present invention.

In the TV camera shown in FIG. 14, there are lens groups 102–105 before a photoelectric converting element (CCD) 101, that is, on the target or object side. Here, denoted at 102 is a focusing lens group, and denoted at 103 is a variation lens group. Denoted at 104 is a compensator lens group, and denoted at 105 is a relay lens group.

The focusing lens group 102 is held by a focusing lens barrel, and it can be moved along the optical axis direction. With this movement of the focusing lens group, the focusing operation is performed. Also, through movements of the variation lens group 103 and the compensator lens group 104, the zooming operation is performed. An image of a subject to be photographed is imaged on the photoelectric converting element 101 after the relay lens group 105, by which a video image is produced.

In the TV camera of the structure described above, the optical unit 22 according to the present invention is fixedly mounted in front of the compensator lens group 104. This enables a portion of a lens group, which should otherwise be required for suppressing the production of aberration, to be substituted with the optical unit 22. By incorporating the optical unit 22 into the optical system of the television camera, the total number of lenses of the optical system as a whole can be reduced. This achieves a TV camera of smaller size and with a simple structure. Also, the manufacturing cost can be lowered significantly.

While the invention has been described with reference to the structures disclosed herein, it is not confined to the details set forth and this application is intended to cover such modifications or changes as may come within the purposes of the improvements or the scope of the following claims.

What is claimed is:

1. An optical unit comprising:

a first optical element having a protrusion; and a second optical element having a recess, wherein relative alignment between said first and second optical elements is accomplished by engagement of the protrusion and the recess, wherein said first and second optical elements are opposed to each other with a predetermined spacing maintained therebetween, and wherein the difference between an optical path length of a light ray passing through the protrusion and an optical path length of a light ray passing through a portion other than the protrusion corresponds to an integer multiple of the wavelength of the light ray.

2. An optical unit comprising:

a first optical element having a protrusion; and a second optical element having a recess, wherein relative alignment between said first and second optical elements is accomplished by engagement of the protrusion and the recess, wherein said first and second optical elements are made of different materials, wherein a space is defined between a free end of the protrusion and a bottom of the recess, and wherein the difference between an optical path length of a light ray passing through the protrusion and an optical path length of a light ray passing through a portion other than the protrusion corresponds to an integer multiple of the wavelength of the light ray.

3. An optical system comprising an optical unit as recited in any one of claims 1 and 2, and a lens.

4. An exposure apparatus having an optical system as recited in claim 3, for projecting and printing a mask pattern onto a surface to be exposed.

5. A device manufacturing method, comprising the steps of:

exposing a workpiece having a photosensitive material applied thereto, with a device pattern and by use of an exposure apparatus as recited in claim 4, and developing the exposed workpiece.

6. A method of manufacturing an optical unit, comprising the steps of:
   selectively removing a predetermined region of a first substrate to produce a step-like shape on the surface of the first substrate, while forming at least one recess in the surface thereof;
   selectively removing a predetermined region of a second substrate to produce a step-like shape on the surface of the second substrate, while forming a protrusion on the surface thereof; and
   engaging the recess and the protrusion so as to relatively position the first and second substrates, and adhering the first and second substrates to each other,
   wherein the first and second substrates are made of different materials, and wherein the height of the protrusion is smaller than the depth of the recess.

7. An optical unit, comprising:
   a first diffractive optical element having a protrusion; and
   a second diffractive optical element having a recess,
   wherein relative alignment between said first and second diffractive optical elements is accomplished by engagement of the protrusion and the recess, wherein said first and second diffractive optical elements are made of materials having different refractive indices, and wherein a gap is formed between a free end of the protrusion and a bottom of the recess.

8. An optical unit according to claim 7, wherein, when the refractive index of the first diffractive optical element is $n_1$, the refractive index of the second diffractive optical element is $n_2$, the refractive index of a material filling the gap between the free end of the protrusion and the bottom of the recess is $n_3$, the depth of the recess is $d_1$, the length of the protrusion is $d_2$, and the center wavelength used is $\lambda$, the following relation is satisfied:

$$n_1 \times d_1 - \{n_2 \times d_2 + n_3 \times (d_1 - d_2)\} = m\lambda X,$$

wherein m is an integer.

9. An optical system comprising an optical unit as recited in claim 7, and a lens.

10. An exposure apparatus having an optical system as recited in claim 9, for projecting and printing a mask pattern onto a surface to be exposed.

11. A device manufacturing method, comprising the steps of:
   exposing a workpiece having a photosensitive material applied thereto, with a device pattern and by use of an exposure apparatus as recited in claim 10; and
   developing the exposed workpiece.

12. An optical unit comprising:
   a first diffractive optical element having a transmissive diffraction grating and a protrusion; and
   a second diffractive optical element having a transmissive diffraction grating and a recess,
      wherein (i) the transmissive diffraction gratings of the first and second optical elements are disposed opposed to each other and (ii) the protrusion and the recess are engaged with each other to align said first and second diffractive optical elements, and
      wherein the diffraction gratings of said first and second diffractive optical elements are made of different materials.

13. An optical unit according to claim 12, wherein the protrusion and the recess have a width of about 10 microns.

14. An optical unit according to claim 12, wherein a gaseous fluid is sealingly maintained between the first and second diffractive optical elements.

15. An optical unit according to claim 14, wherein the gaseous fluid is an inactive gas.

16. An optical unit according to claim 12, wherein said optical unit has only a single focal length.

17. An optical unit according to claim 12, wherein each of said first and second diffractive optical elements has plural diffraction gratings.

18. An optical unit according to claim 12, wherein said first and second diffraction gratings are disposed opposed to each other with a clearance maintained between their opposed surfaces.

19. An optical unit according to claim 18, wherein the clearance corresponds to a groove of the diffraction grating of at least one of said first diffractive optical element and said second diffractive optical element.

20. An optical unit according to claim 12, wherein said first and second diffractive optical elements provide a predetermined lens effect.

21. An optical unit according to claim 12, wherein each of said transmissive diffraction gratings comprises a rotationally symmetric diffraction grating.

22. An optical unit comprising:
   a first diffractive optical element having a transmissive diffraction grating and a protrusion; and
   a second diffractive optical element having a transmissive diffraction grating and a recess,
      wherein (i) the transmissive diffraction gratings of the first and second optical elements are disposed opposed to each other and (ii) the protrusion and the recess are engaged with each other to align said first and second diffractive optical elements, and
      wherein the diffraction gratings of said first and second diffractive optical elements are made of materials having different refractive indices.

23. An optical unit comprising:
   a first diffractive optical element having a transmissive diffraction grating and a protrusion; and
   a second diffractive optical element having a transmissive diffraction grating and a recess,
      wherein (i) the transmissive diffraction gratings of the first and second optical elements are disposed opposed to each other and (ii) the protrusion and the recess are engaged with each other to align said first and second diffractive optical elements, and
      wherein the protrusion is formed in a region in which the diffraction grating of said first diffractive optical element is formed, and wherein the recess is formed in a region in which the diffraction grating of said second diffractive optical element is formed.

24. An optical unit comprising:
   a first diffractive optical element having a transmissive diffraction grating and a protrusion; and
   a second diffractive optical element having a transmissive diffraction grating and a recess,
      wherein (i) the transmissive diffraction gratings of the first and second optical elements are disposed opposed to each other and (ii) the protrusion and the recess are engaged with each other to align said first and second diffractive optical elements, and
      wherein the protrusion has a height which is smaller than the depth of the recess.

25. An optical unit comprising:
   a first diffractive optical element having a transmissive diffraction grating and a protrusion; and
   a second diffractive optical element having a transmissive diffraction grating and a recess, wherein (i) the transmissive diffraction gratings of the first and second optical elements are disposed opposed to each other and (ii) the protrusion and the recess are engaged with each other to align said first and second diffractive optical elements, and wherein a clearance is defined between a free end of the protrusion and a bottom of the recess.

26. An optical unit comprising:

a first diffractive optical element having a transmissive diffraction grating and a protrusion; and a second diffractive optical element having a transmissive diffraction grating and a recess, wherein (i) the transmissive diffraction gratings of the first and second optical elements are disposed opposed to each other and (ii) the protrusion and the recess are engaged with each other to align said first and second diffractive optical elements, and wherein a difference between (i) an optical path length where a light ray incident on said optical unit passes the protrusion and (ii) an optical path length where the light ray passes through a portion other than the protrusion, corresponds to a multiple by an integer, of the wavelength of the incident light ray.

27. An optical unit comprising:

a first diffractive optical element having a transmissive diffraction grating and a protrusion; and a second diffractive optical element having a transmissive diffraction grating and a recess, wherein (i) the transmissive diffraction gratings of the first and second optical elements are disposed opposed to each other and (ii) the protrusion and the recess are engaged with each other to align said first and second diffractive optical elements, and wherein a relation:

$$n_1 \times d_1 - \{n_2 \times d_2 + n_3 \times (d_1 - d_2)\} = m\lambda$$

is satisfied in which m is an integer, $n_1$ is the refractive index of said first diffractive optical element, $n_2$ is the refractive index of said second diffractive optical element, $n_3$ is the refractive index of a material that fills a clearance between a free end of the protrusion and a bottom of the recess, $d_1$ is the depth of the recess, $d_2$ is the protruded amount of the protrusion, and $\lambda$ is a center wavelength of light used.

28. An optical system comprising an optical unit as recited in claim 27, and a lens.

29. An exposure apparatus having an optical system as recited in claim 28, for projecting and printing a mask pattern onto a surface to be exposed.

30. A device manufacturing method, comprising the steps of:

exposing a workpiece having a photosensitive material applied thereto, with a device pattern and by use of an exposure apparatus as recited in claim 29; and developing the exposed workpiece.

31. A method of producing an optical unit, said method comprising:

a first step for performing a photolithographic process and an etching process to a predetermined region on a first substrate, to form a first diffractive optical element having a transmissive diffraction grating and a protrusion on that surface;

a second step for performing a photolithographic process and an etching process to a predetermined region on a second substrate, to form a second diffractive optical element having a transmissive diffraction grating and a recess on that surface; and a third step for relatively aligning the first and second substrates with each other on the basis of engagement between the protrusion and the recess, and for fixing the first and second substrates to each other, wherein (i) the transmissive diffraction gratings of the first and second optical elements are disposed opposed to each other and (ii) the protrusion and the recess are engaged with each other to align the first and second diffractive optical gratings, and wherein the diffraction gratings of the first and second substrates are made of different materials.

32. A method according to claim 31, wherein the protrusion and the recess have a width of about 10 microns.

33. A method according to claim 31, wherein the first and second substrates have step-like structures and a gaseous fluid is sealingly maintained between the step-like structures of the first and second substrates.

34. A method according to claim 33, wherein the gaseous fluid is an inactive gas.

35. A method according to claim 31, wherein an optical unit produced has only a single focal length.

36. A method according to claim 31, wherein the first and second substrates have step-like structures and each of the step-like structures of the first and second substrates is formed with plural diffraction gratings.

37. A method according to claim 31, wherein the first and second substrates have step-like structures and the step-like structures of the first and second substrates are disposed opposed to each other with a clearance maintained between their opposed surfaces.

38. A method according to claim 37, wherein the clearance corresponds to a groove of a diffraction grating formed on at least one of the first substrate and the second substrate.

39. A method of producing an optical unit, said method comprising:

a first step for performing a photolithographic process and an etching process to a predetermined region on a first substrate, to form a first diffractive optical element having a transmissive diffraction grating and a protrusion on that surface;

a second step for performing, a photolithographic process and an etching process to a predetermined region on a second substrate, to form a second diffractive optical element having a transmissive diffraction grating and a recess on that surface; and a third step for relatively aligning the first and second substrates with each other on the basis of engagement between the protrusion and the recess, and for fixing the first and second substrates to each other, wherein (i) the transmissive diffraction gratings of the first and second optical elements are disposed opposed to each other and (ii) the protrusion and the recess are engaged with each other to align the first and second diffractive optical gratings, and wherein the diffraction gratings of the first and second substrates are made of materials having different refractive indices.

40. A method of producing an optical unit, said method comprising:

a first step for performing a photolithographic process and an etching process to a predetermined region on a first substrate, to form a first diffractive optical element having a transmissive diffraction grating and a protrusion on that surface;

a second step for performing a photolithographic process and an etching process to a predetermined region on a second substrate, to form a second diffractive optical element having a transmissive diffraction grating and a recess on that surface; and a third step for relatively aligning the first and second substrates with each other on the basis of engagement between the protrusion and the recess, and for fixing the first and second substrates to each other, wherein (i) the transmissive diffraction gratings of the first and second optical elements are disposed opposed to each other and (ii) the protrusion and the recess are engaged with each other to align the first and second diffractive optical gratings, and wherein the first and second substrates have step-like structures and the protrusion is formed in a region in which the step-like structure of the first substrate is formed, and wherein the recess is formed in a region in which the step-like structure of the second substrate is formed.

41. A method of producing an optical unit, said method comprising:

a first step for performing a photolithographic process and an etching process to a predetermined region on a first substrate, to form a first diffractive optical element having a transmissive diffraction grating and a protrusion on that surface;

a second step for performing a photolithographic process and an etching process to a predetermined region on a second substrate, to form a second diffractive optical element having a transmissive diffraction grating and a recess on that surface; and a third step for relatively aligning the first and second substrates with each other on the basis of engagement between the protrusion and the recess, and for fixing the first and second substrates to each other, wherein (i) the transmissive diffraction gratings of the first and second optical elements are disposed opposed to each other and (ii) the protrusion and the recess are engaged with each other to align the first and second diffractive optical gratings, and wherein the protrusion has a height which is smaller than the depth of the recess.

42. A method of producing an optical unit, said method comprising:

a first step for performing a photolithographic process and an etching process to a predetermined region on a first substrate, to form a first diffractive optical element having a transmissive diffraction grating and a protrusion on that surface;

a second step for performing a photolithographic process and an etching process to a predetermined region on a second substrate, to form a second diffractive optical element having a transmissive diffraction grating and a recess on that surface; and a third step for relatively aligning the first and second substrates with each other on the basis of engagement between the protrusion and the recess, and for fixing the first and second substrates to each other, wherein (i) the transmissive diffraction gratings of the first and second optical elements are disposed opposed to each other and (ii) the protrusion and the recess are engaged with each other to align the first and second diffractive optical gratings, and wherein a clearance is defined between a free end of the protrusion and a bottom of the recess.

43. A method of producing an optical unit, said method comprising:

a first step for performing a photolithographic process and an etching process to a predetermined region on a first substrate, to form a first diffractive optical element having a transmissive diffraction grating and a protrusion on that surface;

a second step for performing a photolithographic process and an etching process to a predetermined region on a second substrate, to form a second diffractive optical element having a transmissive diffraction grating and a recess on that surface; and a third step for relatively aligning the first and second substrates with each other on the basis of engagement between the protrusion and the recess, and for fixing the first and second substrates to each other, wherein (i) the transmissive diffraction gratings of the first and second optical elements are disposed opposed to each other and (ii) the protrusion and the recess are engaged with each other to align the first and second diffractive optical gratings, and wherein a difference between (i) an optical path length where a light ray incident on an optical unit produced passes the protrusion and (ii) an optical path length where the light ray passes through a portion other than the protrusion, corresponds to a multiple, by an integer, of the wavelength of the incident light ray.

44. A method of producing an optical unit, said method comprising:

a first step for performing a photolithographic process and an etching process to a predetermined region on a first substrate, to form a first diffractive optical element having a transmissive diffraction grating and a protrusion on that surface;

a second step for performing a photolithographic process and an etching process to a predetermined region on a second substrate, to form a second diffractive optical element having a transmissive diffraction grating and a recess on that surface; and a third step for relatively aligning the first and second substrates with each other on the basis of engagement between the protrusion and the recess, and for fixing the first and second substrates to each other, wherein (i) the transmissive diffraction gratings of the first and second optical elements are disposed opposed to each other and (ii) the protrusion and the recess are engaged with each other to align the first and second diffractive optical gratings, and wherein a relation:

$$n_1 \times d_1 - \{n_2 \times d_2 + n_3 \times (d_1 - d_2)\} = m\lambda$$

is satisfied in which m is an integer, $n_1$ is the refractive index of the first substrate, $n_2$ is the refractive index of the second substrate, $n_3$ is the refractive index of a material that fills a clearance between a free end of the protrusion and a bottom of the recess, $d_1$ is the depth of the recess, $d_2$ is the protruded amount of the protrusion, and $\lambda$ is a center wavelength of light used.

45. An optical system comprising an optical unit as recited in claim 44, and a lens.

46. An exposure apparatus having an optical system as recited in claim 45, for projecting and printing a mask pattern onto a surface to be exposed.

47. A device manufacturing method, comprising the steps of:
 exposing a workpiece having a photosensitive material applied thereto, with a device pattern and by use of an exposure apparatus as recited in claim 46; and
 developing the exposed workpiece.

48. An exposure apparatus comprising:
 an optical system for projecting and printing a mask pattern onto a surface to be exposed, the optical system including
  (i) a first optical element having a protrusion; and
  (ii) a second optical element having a recess,
   wherein the relative alignment between said first and second optical elements is accomplished by engagement of the protrusion and the recess, and the protrusion and the recess are formed in effective regions of said first and second optical elements, respectively.

49. A device manufacturing method, comprising the steps of:
 exposing a workpiece having a photosensitive material applied thereto, with a device pattern and by use of an exposure apparatus as recited in claim 48; and
 developing the exposed workpiece.

50. An exposure apparatus comprising:
 an optical system for projecting and printing a mask pattern onto a surface to be exposed, the optical system including
  (i) a first diffractive optical element having a protrusion; and
  (ii) a second diffractive optical element having a recess,
   wherein each of the protrusion and the recess is formed outside a diffraction grating surface provided on said first or second diffractive optical element, and wherein relative alignment between said first and second diffractive optical elements is accomplished by engagement of the protrusion and the recess.

51. A device manufacturing method, comprising the steps of:
 exposing a workpiece having a photosensitive material applied thereto, with a device pattern and by use of an exposure apparatus as recited in claim 50; and
 developing the exposed workpiece.

52. An exposure apparatus comprising:
 an optical system, for projecting and printing a mask pattern onto a surface to be exposed, said optical system comprising:
 an optical unit including
  (i) a first optical element having a protrusion; and
  (ii) a second optical element having a recess,
   wherein relative alignment between said first and second optical elements is accomplished by engagement of the protrusion and the recess, and wherein the protrusion and the recess are formed at centers of said first and second optical elements, respectively; and
 a lens.

53. A device manufacturing method, comprising the steps of:
 exposing a workpiece having a photosensitive material applied thereto, with a device pattern and by use of an exposure apparatus as recited in claim 52, and
 developing the exposed workpiece.

54. An exposure apparatus comprising:
 an optical unit for projecting and printing a mask pattern onto a surface to be exposed, the optical unit including
  (i) a first optical element having protrusions; and
  (ii) a second optical element having recesses,
   wherein the protrusions are formed at different positions while the recesses are formed at positions corresponding to the different positions, respectively, and wherein the relative alignment between said first and second optical elements is accomplished by engagement of the protrusions and corresponding recesses, respectively.

55. A device manufacturing method, comprising the steps of:
 exposing a workpiece having a photosensitive material applied thereto, with a device pattern and by use of an exposure apparatus as recited in claim 54; and
 developing the exposed workpiece.

56. An optical unit comprising:
 a first diffractive optical element having a transmissive diffraction grating and a protrusion; and
 a second diffractive optical element having a transmissive diffraction grating and a recess,
  wherein the protrusion and the recess are engaged with each other to align said first and second diffractive optical elements, and
  wherein the protrusion is formed in a region in which the diffraction grating of said first diffractive optical element is formed, and wherein the recess is formed in a region in which the diffraction grating of said second diffractive optical element is formed.

57. An optical unit comprising:
 a first diffractive optical element having a transmissive diffraction grating and a protrusion; and
 a second diffractive optical element having a transmissive diffraction grating and a recess,
  wherein the protrusion and the recess are engaged with each other to align said first and second diffractive optical elements, and
  wherein the protrusion has a height which is smaller than the depth of the recess.

58. An optical unit comprising:
 a first diffractive optical element having a transmissive diffraction grating and a protrusion; and
 a second diffractive optical element having a transmissive diffraction grating and a recess,
  wherein the protrusion and the recess are engaged with each other to align said first and second diffractive optical elements, and
  wherein a clearance is defined between a free end of the protrusion and a bottom of the recess.

59. An optical unit comprising:
 a first diffractive optical element having a transmissive diffraction grating and a protrusion; and
 a second diffractive optical element having a transmissive diffraction grating and a recess,
  wherein the protrusion and the recess are engaged with each other to align said first and second diffractive optical elements, and
  wherein a difference between (i) an optical path length where a light ray incident on said optical unit passes the protrusion and (ii) an optical path length where the light ray passes through a portion other than the protrusion, corresponds to a multiple by an integer, of the wavelength of the incident light ray.

60. An optical unit comprising:
a first diffractive optical element having a transmissive diffraction grating and a protrusion; and
a second diffractive optical element having a transmissive diffraction grating and a recess,
    wherein the protrusion and the recess are engaged with each other to align said first and second diffractive optical elements, and
    wherein a relation:

$$n_1 \times d_1 - \{n_2 \times d_2 + n_3 \times (d_1 - d_2)\} = m\lambda$$

is satisfied in which m is an integer, $n_1$ is the refractive index of said first diffractive optical element, $n_2$ is the refractive index of said second diffractive optical element, $n_3$ is the refractive index of a material that fills a clearance between a free end of the protrusion and a bottom of the recess, $d_1$ is the depth of the recess, $d_2$ is the protruded amount of the protrusion, and $\lambda$ is a center wavelength of light used.

61. An optical system comprising an optical unit as recited in claim 60, and a lens.

62. An exposure apparatus having an optical system as recited in claim 61, for projecting and printing a mask pattern onto a surface to be exposed.

63. A device manufacturing method, comprising the steps of:
    exposing a workpiece having a photosensitive material applied thereto, with a device pattern and by use of an exposure apparatus as recited in claim 62; and
    developing the exposed workpiece.

64. A method of producing an optical unit, said method comprising:
    a first step for performing a photolithographic process and an etching process to a predetermined region on a first substrate, to form a first diffractive optical element having a transmissive diffraction grating and a protrusion on that surface;
    a second step for performing a photolithographic process and an etching process to a predetermined region on a second substrate, to form a second diffractive optical element having a transmissive diffraction grating and a recess on that surface; and
    a third step for relatively aligning the first and second substrates with each other on the basis of engagement between the protrusion and the recess, and for fixing the first and second substrates to each other,
        wherein the first and second substrates have step-like structures and the protrusion is formed in a region in which the step-like structure of the first substrate is formed, and wherein the recess is formed in a region in which the step-like structure of the second substrate is formed.

65. A method of producing an optical unit, said method comprising:
    a first step for performing a photolithographic process and an etching process to a predetermined region on a first substrate, to form a first diffractive optical element having a transmissive diffraction grating and a protrusion on that surface;
    a second step for performing a photolithographic process and an etching process to a predetermined region on a second substrate, to form a second diffractive optical element having a transmissive diffraction grating and a recess on that surface; and
    a third step for relatively aligning the first and second substrates with each other on the basis of engagement between the protrusion and the recess, and for fixing the first and second substrates to each other,
        wherein the protrusion has a height which is smaller than the depth of the recess.

66. A method of producing an optical unit, said method comprising:
    a first step for performing a photolithographic process and an etching process to a predetermined region on a first substrate, to form a first diffractive optical element having a transmissive diffraction grating and a protrusion on that surface;
    a second step for performing a photolithographic process and an etching process to a predetermined region on a second substrate, to form a second diffractive optical element having a transmissive diffraction grating and a recess on that surface; and
    a third step for relatively aligning the first and second substrates with each other on the basis of engagement between the protrusion and the recess, and for fixing the first and second substrates to each other,
        wherein a clearance is defined between a free end of the protrusion and a bottom of the recess.

67. A method of producing an optical unit, said method comprising:
    a first step for performing a photolithographic process and an etching process to a predetermined region on a first substrate, to form a first diffractive optical element having a transmissive diffraction grating and a protrusion on that surface;
    a second step for performing a photolithographic process and an etching process to a predetermined region on a second substrate, to form a second diffractive optical element having a transmissive diffraction grating and a recess on that surface; and
    a third step for relatively aligning the first and second substrates with each other on the basis of engagement between the protrusion and the recess, and for fixing the first and second substrates to each other,
        wherein a difference between (i) an optical path length where a light ray incident on an optical unit produced passes the protrusion and (ii) an optical path length where the light ray passes through a portion other than the protrusion, corresponds to a multiple, by an integer, of the wavelength of the incident light ray.

68. A method of producing an optical unit, said method comprising:
    a first step for performing a photolithographic process and an etching process to a predetermined region on a first substrate, to form a first diffractive optical element having a transmissive diffraction grating and a protrusion on that surface;
    a second step for performing a photolithographic process and an etching process to a predetermined region on a second substrate, to form a second diffractive optical element having a transmissive diffraction grating and a recess on that surface; and
    a third step for relatively aligning the first and second substrates with each other on the basis of engagement between the protrusion and the recess, and for fixing the first and second substrates to each other,
        wherein a relation:

$$n_1 \times d_1 - \{n_2 \times d_2 + n_3 \times (d_1 - d_2)\} = m\lambda$$

is satisfied in which m is an integer, $n_1$ is the refractive index of the first substrate, $n_2$ is the refractive index of the second substrate, $n_3$ is the refractive index of a material that fills a clearance between a free end of the protrusion and a bottom of the recess, $d_1$ is the depth of the recess, $d_2$ is the protruded amount of the protrusion, and $\lambda$ is a center wavelength of light used.

69. An optical system comprising an optical unit as recited in claim 68, and a lens.

70. An exposure apparatus having an optical system as recited in claim 69, for projecting and printing a mask pattern onto a surface to be exposed.

71. A device manufacturing method, comprising the steps of:

exposing a workpiece having a photosensitive material applied thereto, with a device pattern and by use of an exposure apparatus as recited in claim 70; and developing the exposed workpiece.

* * * * *

UNITED STATES PATENT AND TRADEMARK OFFICE
CERTIFICATE OF CORRECTION

PATENT NO. : 6,731,431 B2
DATED : May 4, 2004
INVENTOR(S) : Yoshiyuki Sekine

It is certified that error appears in the above-identified patent and that said Letters Patent is hereby corrected as shown below:

Title page,
Item [*], Notice, insert the following paragraph:
-- This patent issued on a continued prosecution application filed under 37 CFR 1.53(d), and is subject to the twenty year patent term provisions of 35 U.S.C. 154 (a)(2). --
Item [56], References Cited, U.S. PATENT DOCUMENTS, the second-listed document "4,996,447 A * 10/1990 Huang Alan et al........359/571" should read -- 4,966,447 A * 10/1990 Alan et al................359/571 --.
FOREIGN PATENT DOCUMENTS, the third-listed document "JP 10-123388 5/1988" shoud read -- JP 10-123388 5/1998 --.

Column 4,
Line 29, "pass" should read -- passes --.
Line 30, "are" should read -- is --.

Column 5,
Line 33, "ands" should read -- and --.

Column 6,
Line 60, "may he" should read -- may be --.

Column 7,
Line 42, "27." should read -- 27 --.

Column 8,
Line 51, "portion" should read -- portions --.

Column 12,
Line 65, "claim 4," should read -- claim 4; --.

Column 13,
Line 36, "$n_1 \times d_1 - \{n_2 \times d_2 + n_3 \times (d_1 - d_2)\} = m\lambda X$," should read -- $n_1 \times d_1 - \{n_2 \times d_2 + n_3 \times (d_1 - d_2)\} = m\lambda$, --.

Column 16,
Line 43, "performing," should read -- performing --.

UNITED STATES PATENT AND TRADEMARK OFFICE
CERTIFICATE OF CORRECTION

PATENT NO. : 6,731,431 B2
DATED : May 4, 2004
INVENTOR(S) : Yoshiyuki Sekine

It is certified that error appears in the above-identified patent and that said Letters Patent is hereby corrected as shown below:

Column 19,
Line 65, "claim 52," should read -- claim 52; --.

Signed and Sealed this

Twenty-fourth Day of August, 2004

JON W. DUDAS
*Director of the United States Patent and Trademark Office*